(12) United States Patent
Copley et al.

(10) Patent No.: US 6,310,567 B1
(45) Date of Patent: *Oct. 30, 2001

(54) PROGRAMMABLE CONFIGURATION, LEVEL AND OUTPUT VOLTAGE RANGE CIRCUITS AND METHODS FOR SIGNAL PROCESSORS

(75) Inventors: Patrick P. Copley, Sunnyvale; William C. Rempfer, Los Altos; James L. Brubaker, San Jose, all of CA (US)

(73) Assignee: Linear Technology Corporation, Milipitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/390,178

(22) Filed: Sep. 7, 1999

(51) Int. Cl.[7] ..................................................... H03M 1/18
(52) U.S. Cl. ........................... 341/139; 327/355; 327/334; 324/140; 364/768
(58) Field of Search .................................... 341/144, 147, 341/157, 139, 131, 51, 136, 143, 160

(56) References Cited

U.S. PATENT DOCUMENTS

| | | | |
|---|---|---|---|
| 4,891,645 | 1/1990 | Lewis et al. | 341/154 |
| 5,541,600 | * 7/1996 | Blumenkrantz et al. | 341/139 |
| 5,592,164 | * 1/1997 | Hilbert et al. | 341/120 |
| 5,821,889 | * 10/1998 | Miller | 341/139 |

OTHER PUBLICATIONS

Linear Technology Databook for LTC 1591/LTC 1597, *14–Bit and 16–Bit Parallel Low Glitch Muliplying DACs with 4–Quadrant Resistors*, 1997.
Linear Technology Databook for LTC 1595/LTC 1596, *Serial 16–Bit Multiplying DACs*, 1997.
Linear Technology Databook for LTC 1650, *Low Glitch 16–Bit Voltage Output DAC*, 1998.
Linear Technology Databook for LTC 1599, *16–Bit Wide, Low Glitch Muliplying DACs with 4–Quadrant Resistors*, 1999.

* cited by examiner

Primary Examiner—Michael Tokar
Assistant Examiner—Lam T. Mai
(74) Attorney, Agent, or Firm—Fish & Neave; Robert W. Morris; Joel Weiss

(57) ABSTRACT

A signal processor circuit which receives an input signal and two control words and is programmable to vary the level and the output voltage range of the output signal is provided. The signal processor includes a converter circuit and a level circuit which provide the output circuit with intermediate signals based on input control signals, e.g., input digital words. The output circuit receives an additional control signal and the intermediate signals and is programmable to modify the output voltage range and level of the output signal based on the additional control signal, e.g., a digital word.

30 Claims, 10 Drawing Sheets

| CONFIGURATION | V$_{REF}$ (VOLTS) | SWITCH 231 | SWITCH 232 | SWITCH 233 | SWITCH 234 | R$_{PFB}$ | R$_{POFS}$ | OUTPUT RANGE (VOLTS) |
|---|---|---|---|---|---|---|---|---|
| UNIPOLAR | 5 | 0 | 0 | 1 | 1 | R | INFINITY | 0 → 5 |
| UNIPOLAR | 5 | 0 | 0 | 0 | 1 | 2R | INFINITY | 0 → 10 |
| BIPOLAR | 5 | 1 | 1 | 0 | 1 | 2R | 2R | ± 5 |
| BIPOLAR | 5 | 1 | 1 | 0 | 0 | 4R | 2R | ± 10 |
| BIPOLAR | 5 | 1 | 1 | 1 | 1 | R | 2R | ± 2.5 |
| BIPOLAR | 5 | 1 | 0 | 0 | 1 | 2R | 4R | -2.5 → 7.5 |

FIG. 7

| CONFIGURATION | V<sub>REF</sub> (VOLTS) | K | SWITCH 321 | SWITCH 322 | SWITCH 316 | SWITCH 317 | SWITCH 802 | SWITCH 804 | SWITCH 806 | R<sub>PFB</sub> | R<sub>POFS</sub> | R<sub>PG</sub> | OUTPUT RANGE (VOLTS) |
|---|---|---|---|---|---|---|---|---|---|---|---|---|---|
| UNIPOLAR | 5 | 0.5 | 1 | 1 | 0 | 0 | 0 | 1 | 1 | 2R | INFINITY | 2R | 0 → 5 |
| UNIPOLAR | 5 | 0.5 | 1 | 1 | 0 | 0 | 1 | 1 | 0 | 2R | INFINITY | 2/3R | 0 → 10 |
| BIPOLAR | 5 | 0.5 | 1 | 0 | 1 | 0 | 0 | 1 | 1 | 4R | 4R | 2R | ± 5 |
| BIPOLAR | 5 | 0.5 | 1 | 0 | 1 | 1 | 1 | 0 | 0 | 4R | 2R | 4/5R | ± 10 |
| BIPOLAR | 5 | 0.5 | 1 | 1 | 1 | 0 | 0 | 1 | 0 | 2R | 4R | 4R | ± 2.5 |
| BIPOLAR | 5 | 0.5 | 1 | 1 | 1 | 0 | 1 | 0 | 0 | 2R | 4R | 4/5R | -2.5 → 7.5 |

PROGRAMMABLE CONFIGURATION, LEVEL AND OUTPUT VOLTAGE RANGE CIRCUITS AND METHODS FOR SIGNAL PROCESSORS

FIELD OF THE INVENTION

The present invention relates to a signal processor incorporating digital to analog converters. More particularly, the present invention relates to methods and apparatus for varying the circuit configuration, output voltage range (the difference between the lowest possible output voltage and the highest output voltage) and level (the variance, however small or large, between ground and the lower limit of the output signal range) of such a signal processor.

BACKGROUND OF THE INVENTION

A digital to analog converter (DAC) converts a digital input word to an analog output. Signal processors which utilize DACs typically operate in either a unipolar or bipolar mode, both of which will be briefly described below.

The generic equation for determining $V_{OUT}$ in unipolar and bipolar signal processor is shown in Equation 1:

$$V_{OUT} = G * V_{REF} * \left(K1 * \frac{\text{INPUT CODE}}{\text{MAX INPUT CODE}} - K2\right) \quad (1)$$

where MAX INPUT CODE is the maximum value of INPUT CODE or $2^n - 1$, when INPUT CODE is an n-bit digital word, G is the gain of the signal processor and K1 and K2 are constants that determine the configuration mode. In the unipolar mode configuration (e.g., when the output voltage varies from 0 volts to 5 volts K1=1 and K2=0 so that $V_{OUT}$ varies between 0 and $|G*V_{REF}|$. In the bipolar mode configuration (e.g., output voltage varies from −5 volts to 5 volts), K1=2 and K2=1 so that $V_{OUT}$ varies between $\pm G*V_{REF}$.

FIG. 1 shows an example of a previously known unipolar signal processor 10, which receives an input voltage $V_{REF}$, control signal UPDATE and INPUT CODE, and generates analog output $V_{OUT}$. INPUT CODE typically is an n-bit digital word that signal processor 10 uses to convert digital input voltage $V_{REF}$ to analog output $V_{OUT}$. UPDATE is a binary input signal which determines when the INPUT CODE can be used to convert $V_{REF}$ to produce a new $V_{OUT}$. When UPDATE is LOW, $V_{OUT}$ remains substantially constant. When UPDATE changes from LOW to HIGH, DAC 10 converts $V_{REF}$ to analog output $V_{OUT}$ based on the INPUT CODE.

Signal processor 10 includes current converter (DAC) stage 12, op-amp 22, capacitor 24 feedback resistor 20 and switch-resistance compensation element $S_F$. Current converter stage 12 includes R-2R ladder 14, switches $16_1$ to $16_n$ and latch and decoder 18 and switch-resistance compensation element $S_T$.

The R-2R ladder 14 is coupled between $V_{REF}$ and switches $16_1$ to $16_n$, and includes n branches each containing a resistor $25_i$ and a termination branch having resistor 27 and switch-resistance compensation element $S_T$. The R-2R ladder 14 includes a resistor 23 between the top nodes of each branch. Typically, resistors 25 are twice as large as resistors 23. Termination branch resistor 27 is of the same value as resistors $25_i$. Switch-resistance compensation element $S_T$ of the termination branch is connected to GROUND. Resistor 27 and switch-resistance compensation element $S_T$ of the termination branch serve to balance the impedance of the R-2R ladder 14 at each top node. Without the termination branch, the current flowing through each branch would differ and thereby cause errors in the current conversion process.

The INPUT CODE in combination with the reference voltage causes an intermediate current, $I_{DAC}$ to flow according to Equation 2, R is the input impedance of the R-2R ladder:

$$I_{DAC} = \left(\frac{V_{REF}}{R}\right) * \left(\frac{\text{INPUT CODE}}{\text{MAX INPUT CODE}}\right) \quad (2)$$

Feedback resistor 20, feedback switch-resistance compensation element $S_F$, op-amp 22 and capacitor 24 form a current to voltage converter. The op-amp 22 has an inverting input (−) coupled to current converter 12, feedback resistor 20 and capacitor 24, a non-inverting input (+) coupled to GROUND, and an output coupled to $V_{OUT}$. Capacitor 24 is coupled between inverting input (−) and $V_{OUT}$ to provide a first feedback loop around the op-amp 22. This first feedback loop is not required for operation. Feedback resistor 20 and switch-resistance element $S_F$ are coupled between inverting input (−) and $V_{OUT}$ to provide a second feedback loop around the op-amp 22. Switch-resistance compensation element $S_F$, like switch-resistance compensation element $S_T$, is required for matching of the on-resistance of switches $16_i$, from the R-2R ladder 14.

The current to voltage converter operates to convert intermediate current $I_{DAC}$ to the output voltage $V_{OUT}$. The resulting, $V_{OUT}$ is shown in Equation 3:

$$V_{OUT} = -I_{DAC} * R = -V_{REF} * \left(\frac{\text{INPUT CODE}}{\text{MAX INPUT CODE}}\right) \quad (3)$$

FIG. 2 shows a bipolar signal processor 30 which includes circuit 14, comprising an inverting amplifier 40 and gain resistors 42 and 44 coupled between $V_{REF}$, and current converter 12. Amplifier 40 and gain resistors 42 and 44 serve to invert input voltage $V_{REF}$. Inverted $V_{REF}$ (i.e., $-V_{REF}$) is used to generate $I_{REF}$, as described above in FIG. 1. Alternatively, amplifier 40 and resistors 42 and 44 could be located external to signal processor 30 in the signal path.

$V_{REF}$ is also coupled to level resistor 38, which is then coupled to the inverting input of op-amp 22 via switch-resistance compensation element $S_O$. Capacitor 24 and feedback resistor 36 are coupled between inverting input (−) and $V_{OUT}$, to provide first and second feedback loops, respectively, around op-amp 22. This is one technique for applying opposite polarity to the current converter and to the level circuitry, a condition which is required for operation of the DAC. However, other suitable techniques for establishing this condition are well-known in the art. Switch-resistance compensation elements $S_O$ and $S_F$ are included in the circuit to match the impedance of the switches in the R-2R ladder 14 described above in FIG. 1.

A first signal path from $V_{REF}$ to $V_{OUT}$ via level resistor 38, feedback resistor 36 and op-amp 22, inverts the input signal $V_{REF}$ at $V_{OUT}$. A second signal path from $V_{REF}$ to $V_{OUT}$ via gain resistors 42, 44, inverting amplifier 40, current converter 12 and op-amp 22, produces the voltage shown in Equation 4 at $V_{OUT}$:

$$V = -I_{DAC} \cdot 2R \quad (4)$$

where $I_{DAC}$ is defined by Equation 2. The total output voltage at $V_{OUT}$ is the combination of the voltage from the first and second signal paths and is shown in Equation 5:

$$V_{OUT} = V_{REF} * \left\{ 2 * \left\{ \frac{\text{INPUT CODE}}{\text{MAX INPUT CODE}} \right\} - 1 \right\} \quad (5)$$

Equation 5 equals the desired result of the voltage conversion shown in Equation 1 for a bipolar configuration where K1=2, K2=1 and G=1. Thus, for a 10 volt input ($V_{REF}$=10), the first signal path yields a voltage of −10 volts, while the second signal path provides a voltage between 0 and 20 volts based on the INPUT CODE so that $V_{OUT}$ has a range of ±10 volts.

The prior art consists of various configurations of signal processor 10 and/or signal processor 30 from FIGS. 1 and 2 in monolithic or discrete form. The configuration was typically chosen to be unipolar or bipolar only and connected permanently as such. To make the configuration switchable between unipolar and bipolar modes, however, extra discrete switches and operational amplifiers have been added, as shown in FIG. 3.

In FIG.3, non-inverting amplifier 52 and switch 56 are connected to the signal processor 30 from FIG. 2. Amplifier 52 has inverting input (−) and its output coupled to resistor 38 and noninverting input (+) coupled to switch 56. Switch 56 is provided to couple noninverting input (+) to either $V_{REF}$ or $V_{OUT}$ based on an external logic signal. The signal processor in FIG. 3 operates in unipolar mode when switch 56 connects noninverting input(+) of amplifier 52 to $V_{OUT}$ and operates in bipolar mode when switch 56 connects noninverting input (+) of amplifier 52 to $V_{REF}$. Otherwise the signal processor in FIG. 3 operates in essentially the same manner as those described above in FIGS. 1 and 2 based on the selected mode. The additional external op-amp 52 (and switch 56) adds an offset and, as such, may provide less than optimum dc performance of the signal processor.

Additionally, the ac performance of the signal processor is not optimum due to the finite bandwidth and slew rate of this op amp. A specific implementation of the circuit shown in FIG. 3 is shown in the data sheet for LTC 1597 produced by Linear Technology Corporation of Milpitas, California.

SUMMARY OF THE INVENTION

Accordingly, it is the object of this invention to provide methods and apparatus for varying the circuit configuration, output voltage range and level of a signal processor in a monolithic solution without the need to add substantial external circuitry, complexity and cost.

The signal processor of the present invention includes a converter circuit and utilizes resistors (or other suitable impedance elements) and programmable switches to control whether the signal processor operates in unipolar or bipolar mode, to set the output voltage range, the level of the circuit and/or to provide an asymmetrical range for output signal. Sets of resistors and programmable switches are preferably provided in a level resistor circuit and/or a feedback resistor circuit to enable the invention.

In an alternative embodiment a signal processor that receives an input signal, a first control word and a second control word, and provides an output signal is provided. The signal processor includes at least two control elements, each of which receives an input signal and a control word and provides a respective intermediate signal. The input signal for one of the control elements is the output signal of the signal processor. This embodiment of the signal processor also includes a summing element that receives a combination of the intermediate signals such that the level, linearity or output signal range of the output signal are programmable based on the control words.

In one embodiment, the signal processor can include a programmable level circuit which functions as a third control element, receives an additional digital word, and preferably serves to adjust the level of the circuit.

Additionally, the present invention can preferably use a single reference voltage to provide an asymmetrical output range by selecting the appropriate resistor and switch combination for the level and feedback resistor circuits.

The present invention also provides for a method of varying the configuration, output voltage range or level of a signal processor. The method determines the mode of operation of the circuit (e.g., unipolar or bipolar), the output voltage range or the level of output signal using programmable switches

BRIEF DESCRIPTION OF THE DRAWINGS

FIG. 7 is a table illustrating the effect of various switch configurations on the output voltage of a signal processor according to the invention.

FIG. 10 is a table illustrating the effect of various switch configurations on the output voltage of a signal processor according to the invention.

DETAILED DESCRIPTION OF THE INVENTION

Figure 4:
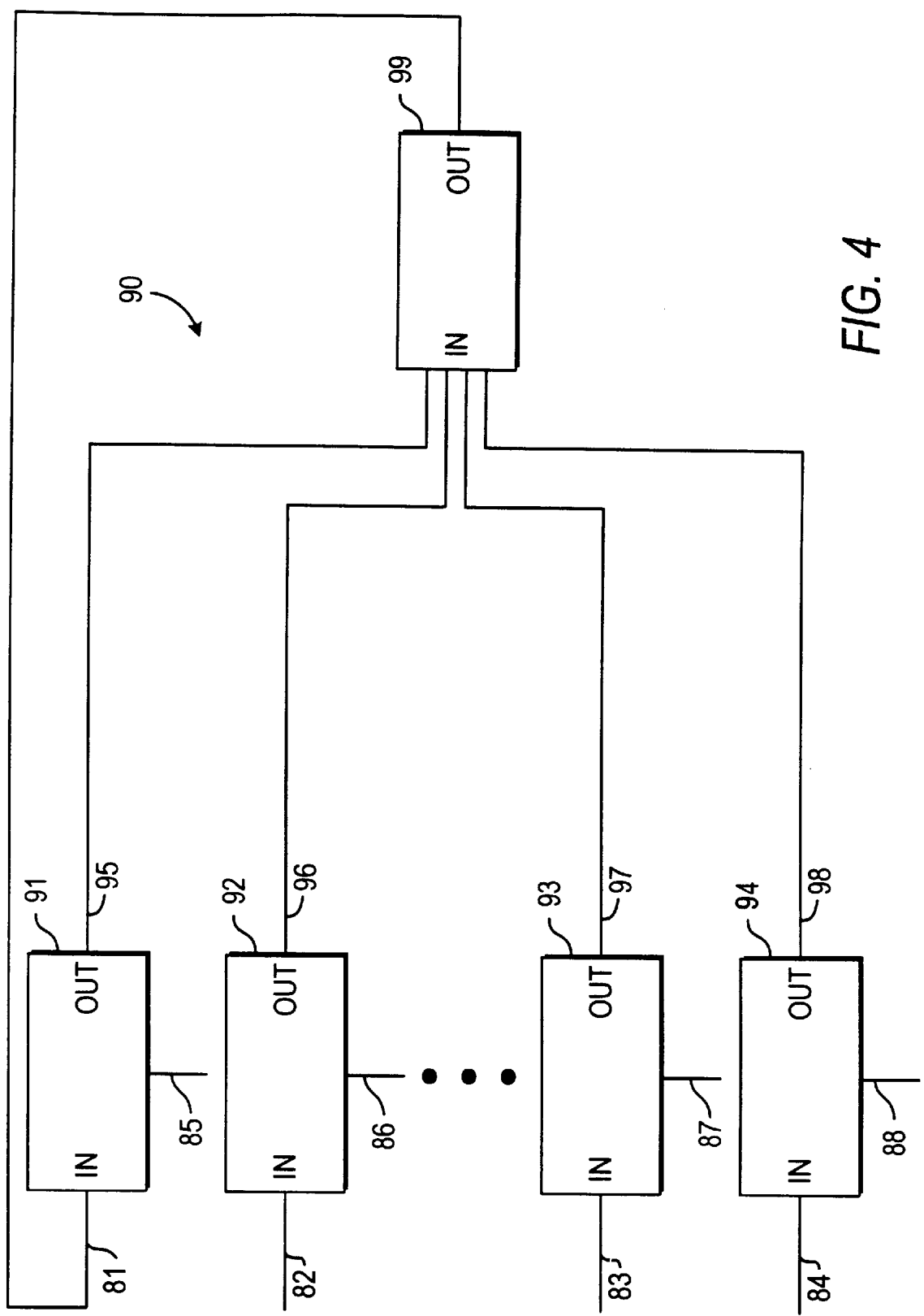
FIG. 4 is a block diagram of a signal processor according to the present invention.

FIG. 4 shows a block diagram of a signal processor 90 according to the present invention. The signal processor is composed of control elements 91–94 (the minimum number of control elements is two), which each receive a control word, e.g., a digital word, and an input signal, e.g., a reference signal, respectively. Input signals 81–84 indicate reference signals. Input signal 81 is shown as being the output signal of the signal processor. Thus, control element 91 preferably functions as a programmable feedback element. Input words 85–88 indicate control words or signals. The control elements, including element 91, each produce intermediate outputs 95–98 based on the respective control word and the input signal input to each element (the intermediate outputs can be either voltage or current). The intermediate outputs are then used as inputs to a summing element 99, which produces an output signal 81 representing a sum of all of the intermediate outputs from control elements 91–94.

In the preferred embodiment of a signal processor according to the invention, the control words can be used to determine the gain, output signal range, level or linearity (e.g., the linearity of the individual digital steps, or the accuracy with respect to ground) of the output signal. For example, signals 81 and 82 can be processed together with control words 85 and 86 to determine the output voltage range, level and linearity of the output signal.

Figure 5:
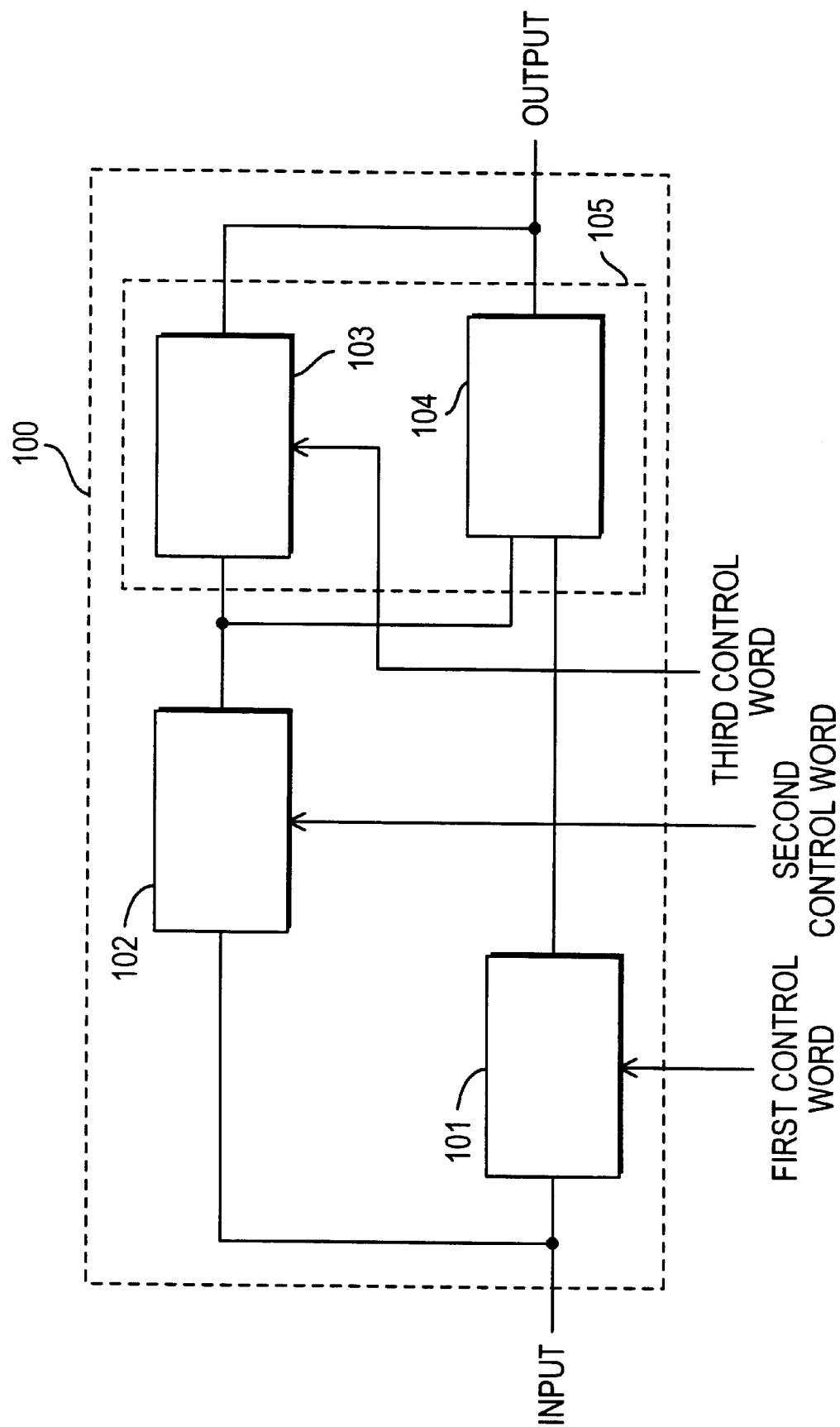
FIG. 5 is another block diagram of a signal processor according to the present invention.

FIG. 5 shows another block diagram of a signal processor 100 according to the present invention. The signal processor 100 is composed of a converter circuit 101, level circuit 102, feedback circuit 103 and amplifier 104. Feedback circuit 103 and amplifier 104 combine to form output circuit 105. The INPUT signal is received by the converter circuit 101 and, when present, level circuit 102. The converter circuit 101 receives the INPUT signal and adapts it to provide a first intermediate signal to the amplifier 104, which produces the OUTPUT signal. Level circuit 102 may be used to provide a second intermediate signal to amplifier 104, and feedback circuit 103 provides a feedback path for amplifier 104. The signal processor 100 can be programmed by a single control signal. This control signal can include a single digital word including a first control word provided to the converter circuit, a second control word provided to the level circuit (when present) and a third control word provided to the feedback circuit, or three separate digital words (when the level circuit is present) provided to the converter circuit, the level circuit and the feedback circuit. Feedback circuit 103 and amplifier 104 may be considered as the output circuit because the feedback portion provides a feedback path for amplifier 104.

Figure 1:
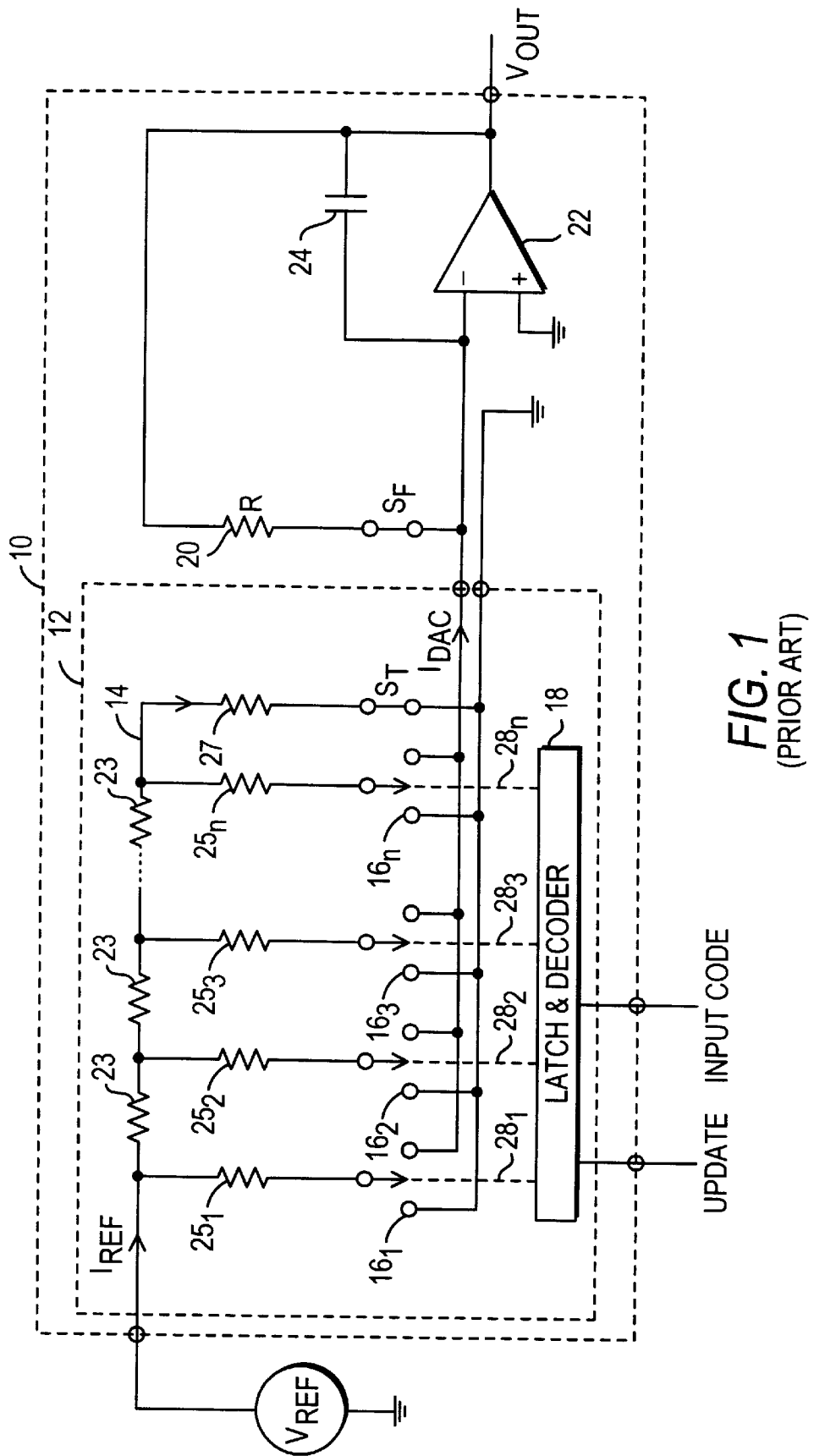
FIG. 1 illustrates a conventional unipolar signal processor.
Figure 2:
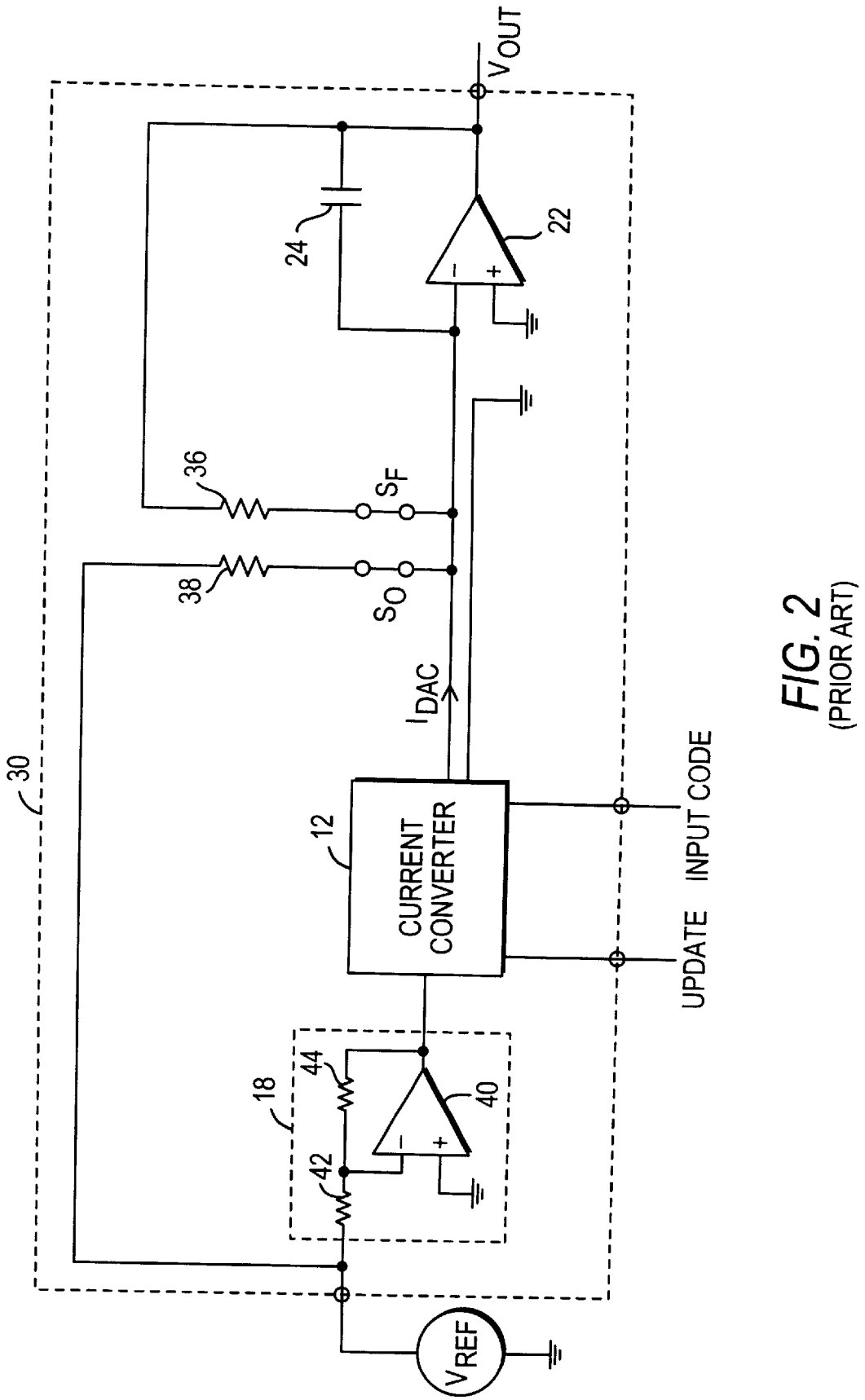
FIG. 2 illustrates a conventional bipolar signal processor.
Figure 3:
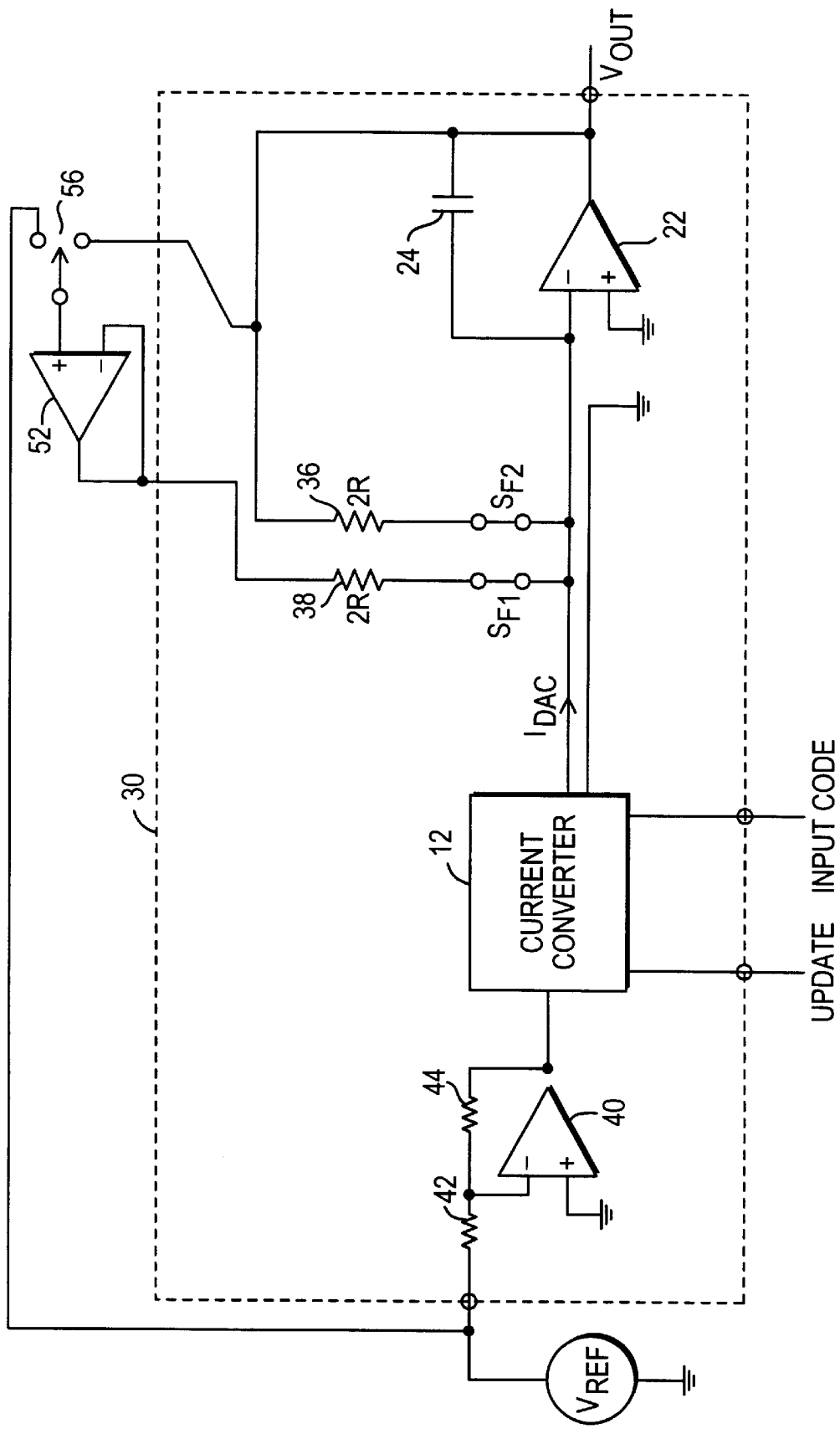
FIG. 3 illustrates a conventional configurable signal processor using discrete components.

The converter circuit may preferably work similarly to converter circuit 12 shown in detail in FIG. 1. Generally, the invention provides that the output circuit includes various sets of switches and resistors which can be programmed by a control signal, e.g., a digital word, to modify the output voltage range and level of $V_{OUT}$ using the intermediate signal from the converter circuit 101 and the intermediate signal from level circuit 102. As mentioned above, the various control words may be provided as one or more control signals in either serial or parallel form.

Figure 6:
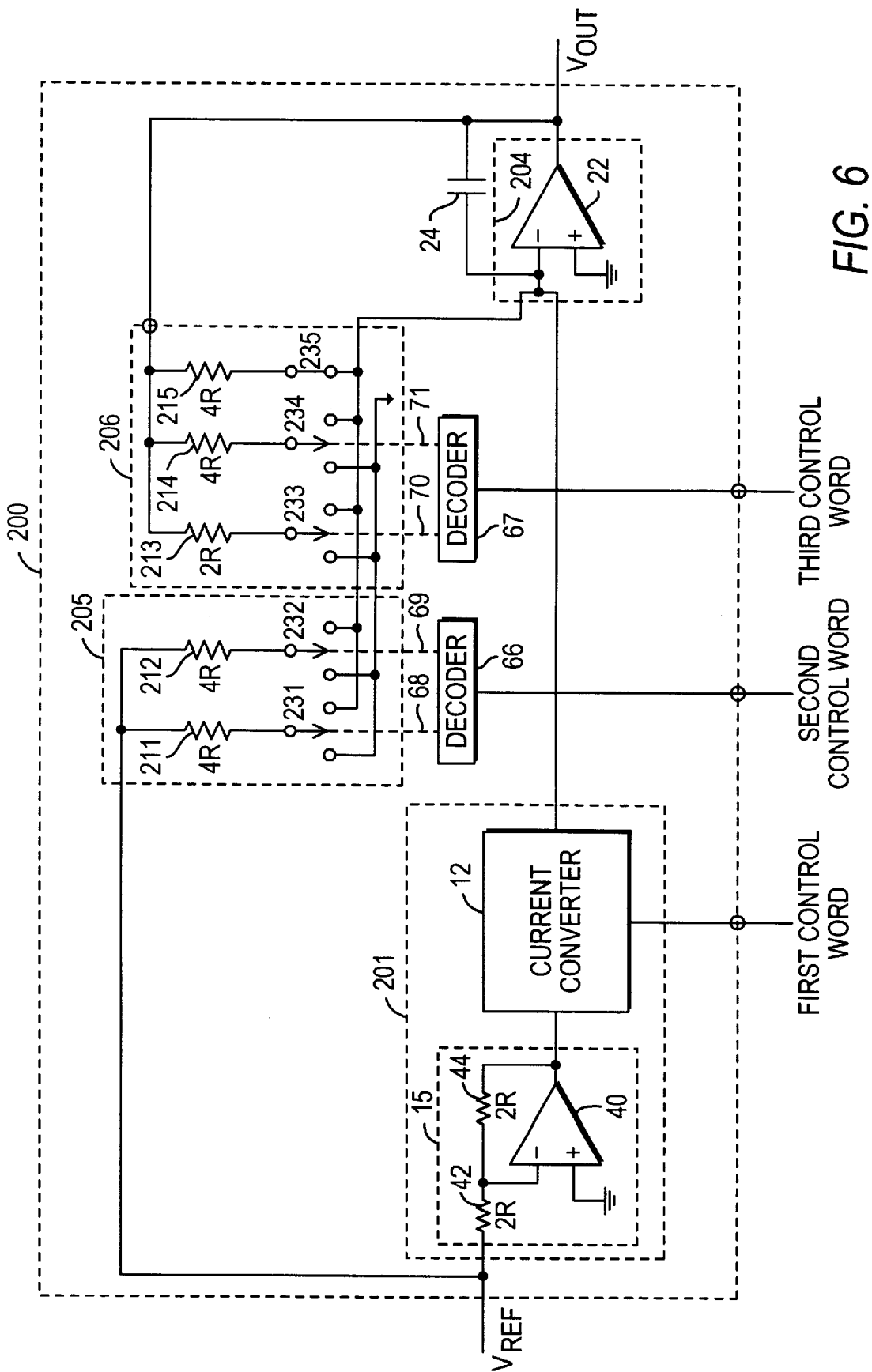
FIG. 6 is a specific embodiment of a signal processor according to the present invention.

FIG. 6 shows a signal processor according to the principles of the invention. The converter circuit 201 preferably includes current converter 12, which is used to modify the magnitude of the INPUT signal based on a control signal, e.g., a first digital word, and inverter circuit 15. The converter circuit 201 provides a intermediate signal as an output. In the circuit shown in FIG. 6, this intermediate signal is expressed as a current.

Current converter 12 is preferably a 16-bit current output DAC. The DAC is used to control the output in discreet steps with a digital input word.

These DACs are well-known in the art. Examples of these DACs are LTC 1595, 1596, 1597, or 1599, produced by Linear Technology Corporation, of Milpitas, Calif. However, any suitable DAC could be used. Current converter 12 has an equivalent impedance value $R_{DAC}$. The inverter circuit 15 can be formed of amplifier 40 and gain resistor 42 and 44 which are described above. The gain resistors 42 and 44 can be replaced with a series of programmable switches and resistors (not shown) to modify the magnitude of the INPUT signal. These modifications should preferably be made in the same manner as described below in detail with respect to the level and feedback circuits.

Signal processor 200 also includes resistors 211–215, switches 231–234 and decoders 66 and 67, to allow for the programmability of the configuration, output voltage range and level of the circuit, as will be explained.

Resistors 211,212 and switches 231,232 form programmable level resistor circuit 205 with value $R_{POFS}$. Programmable level resistor circuit 205 may preferably be implemented to provide a second intermediate signal to the output circuitry.

Resistors 213–15 and switches 233–234 form programmable feedback resistor circuit 206 with value $R_{PFB}$. Resistor circuits 205 and 206 of FIG. 6 can preferably be configured using a single control signal. Resistor 215 and switch-resistance compensation element 235 provide feedback around amplifier 204. Resistors 215 and switch-compensation element 235 can be omitted if at least one of switches 233, 234 is coupled to the inverting input of amplifier 204. Programmable feedback resistor circuit 206 provides a feedback path for amplifier 204. Amplifier 204 and feedback resistor circuit 206 form the output circuit of signal processor 200.

In the embodiment of the invention shown in FIG. 6, resistor 211 and 212 have value 4R and resistors 213, 214 and 215 have values 2R, 4R and 4R, respectively. Thus, feedback resistor circuit 206 can assume one of four values: $R_{PFB}$=R, 4/3R, 2R, and 4R.

R represents the unit impedance for this circuit (such as a resistance or other suitable impedance). This unit impedance can be formed by a single resistor or by a complex combination of resistors, as is well known in the art. The remaining resistors can then be ratioed to the unit resistance as additional individual resistors, or also in complex combinations.

The switches have ON-resistances which preferably are much smaller in value than the individual resistors to which they are coupled. The switches are scaled so the ratio between the switch ON-resistances is the same as the ratio between the associated resistors. Hence the combined imdedance value of resistor plus switch ON-resistance for each branch remains precisely ratioed over temperature and supply variations. A multiple NMOS switch combination is the preferred switch implementation. However, other suitable switches may also be used. As with the resistors, the switches may also be formed from more complex combinations.

Level resistor circuit 205 can assume one of three values: $R_{POFS}$=2R, 4R and infinite. Additional switches and resistors can be added to obtain more programmed values for $R_{PFB}$ and $R_{POFS}$ as desired or the values of the unit resistors can be changed to provide a different set of values. The output voltage $V_{OUT}$ of signal processor 200 is shown in Equation 6:

$$V_{OUT} = V_{REF} * \left( \frac{R_{PFB}}{R_{DAC}} * \frac{\text{INPUT CODE}}{\text{MAX INPUT CODE}} - \frac{R_{PFB}}{R_{POFS}} \right) \quad (6)$$

wherein $R_{PFB}/R_{DAC}$=G*K1 and $R_{PFB}/R_{POFS}$=G*K2 from Equation 1. The various combinations of the values $R_{PFB}$ and $R_{POFS}$ enable the configuration and output voltage range of signal processor 200 to be programmable without the addition of external components.

Decoders 66 and 67 generate control signals 68–71 adapted from the control signal directed to circuits 205 and 206 to control whether any of switches 231-34 are connected to GROUND or the inverting input (–) of op-amp 22. The control signal input to decoders 66 and 67 can preferably be derived from one set of control bits. However, the control signal can also be input as individual control words, e.g., a second control word and a third control word.

If both switches 231 and 232 are connected to GROUND, the level resistor circuit 205 has a value of $R_{POFS}$=infinite (i.e., open circuit). When $R_{POFS}$ has an infinite value, the signal processor 200 is configured to be in unipolar mode. For instance, if $R_{POFS}$ is infinite then $R_{PFB}/R_{POFS}$=0 and thus K2 from Equation 1 is 0 which means the circuit operates in unipolar mode. $V_{OUT}$ for operation in unipolar mode is shown in Equation 7:

$$V_{OUT} = V_{REF} * \frac{R_{PFB}}{R_{DAC}} * \frac{\text{INPUT CODE}}{\text{MAX INPUT CODE}} \quad (7)$$

where $R_{PFB}/R_{DAC}$=1, 2 or 4. If any or all of the switches in level resistor circuit 205 are turned ON (connected to inverting input (−) of op-amp 22), then the signal processor will operate in bipolar mode.

Programmable feedback resistor circuit 206 and capacitor 24 (capacitor 24 is not required for operation of the circuit) provide first and second feedback circuits around op-amp 22. The value of feedback resistor circuit $R_{PFB}$ allows the output voltage range and level of signal processor 200 to be programmed by a digital input from decoder 66. Equation 6 shown above describes the bipolar configuration where $R_{PFB}/R_{POFS}$ determines the level and $R_{PFB}/R_{DAC}$ determines the output voltage range of the circuit.

FIG. 7 shows a table with exemplary values for $V_{REF}$, switches 231–34, $R_{PFB}$, $R_{POFS}$ and the resulting mode of operation and output voltage range for a given input voltage. Before analyzing the values in the table in FIG. 7, it should be noted that the level and the output voltage range are opposite polarity signals, and the polarity can be switched such that either one is negative or positive with respect to ground.

The values in the table correspond to the followings guidelines: when the level is smaller than the output voltage range, the output is bipolar (and can be either symmetric or asymmetric). When the level is zero, the output is unipolar. When the level is greater than the output voltage range, then the output is level-shifted unipolar (not shown in FIG. 7). The level value in symmetrical bipolar range is one half the output voltage range. Finally, the values of the output voltage range and level can cover a relatively large range of values depending on impedance, voltage or current ratios.

In the table of FIG. 7, switches set to 0 are turned OFF (connected to GROUND) and switches set to 1 are turned ON (coupled to inverting input (−) of op-amp 22). If both switches 231 and 232 are turned OFF, then the configuration is unipolar and the output voltage range, either zero to 5 volts, or zero to 10 volts, is determined by which feedback switches 233 and 234 are turned ON. If each of switches 231 and 232 is turned ON then the configuration is bipolar and the range, which is determined as above, is symmetrical about 0. However, if switch 231 is turned ON, then the configuration is still bipolar, but the output range is asymmetrical about ground. Explanation of the other combinations have been eliminated for the sake of brevity.

The programmable level resistor circuit 205 can be implemented with a level resistor and a switch-resistance compensation element. Alternatively, programmable level resistor circuit 205 could be removed from the circuit to provide a unipolar signal processor with programmable output voltage range. Each alternative uses feedback resistor circuit 206 to program the output voltage range of the circuit.

Likewise, the programmable feedback resistor circuit 206 can be implemented with a feedback resistor and a switch-compensation element. In this configuration, programmable level resistor circuit 205 enables the mode of the signal processor to be set as either unipolar or bipolar and it also enables the user to provide an asymmetrical output voltage range if more than one set of resistors and switches is used in the level resistor circuit 205. Thus, while the output voltage range in the output is fixed by the value of the feedback resistor, the mode and level remains programmable in this configuration. In addition, even though the feedback circuit is fixed, it is possible to program the output voltage range by providing programmable gain to inverter circuit 15.

Figure 8:
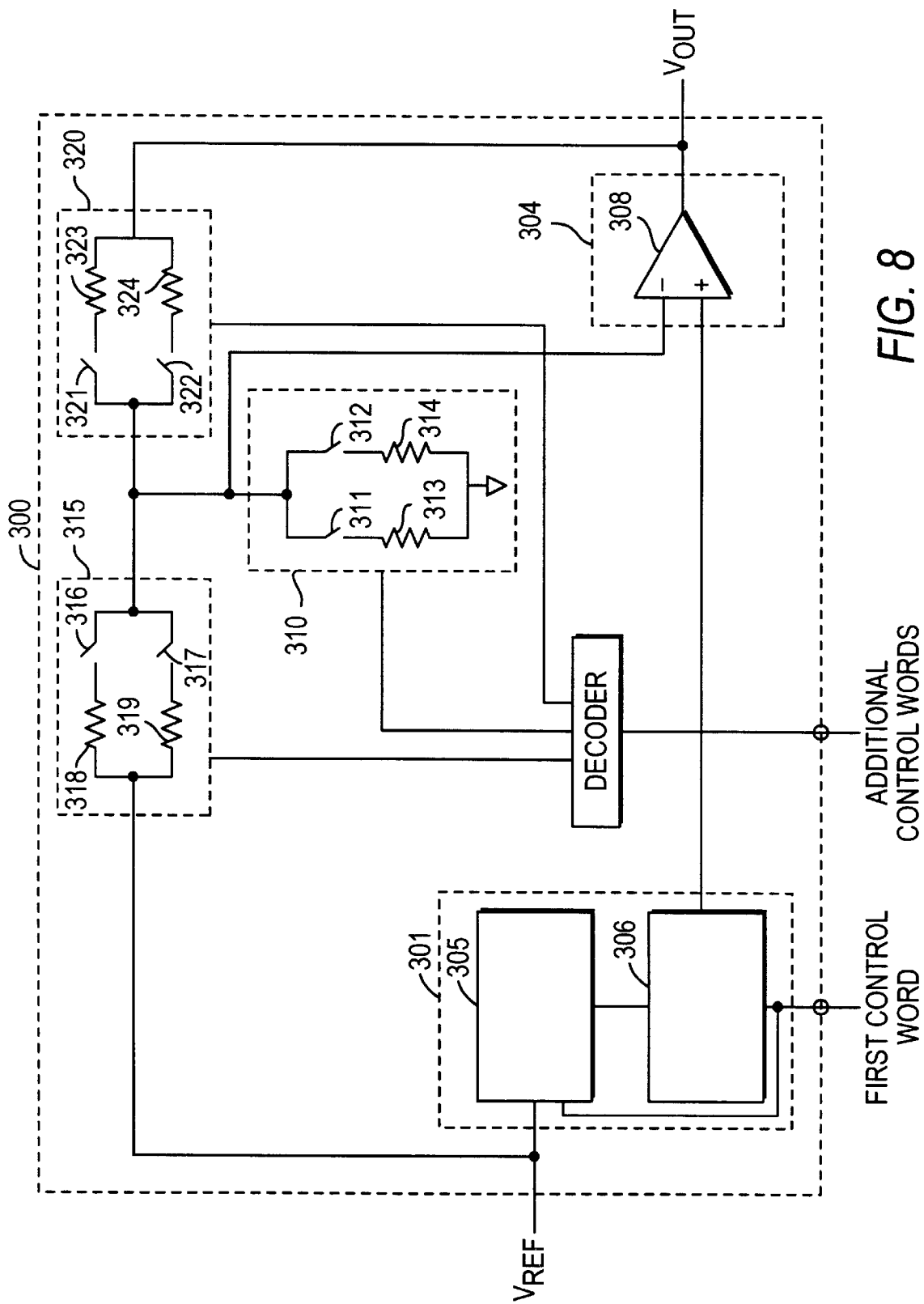
FIG. 8 is an alternative embodiment of a signal processor according to the present invention.

An alternative embodiment of the invention is shown in FIG. 8 in which the first intermediate signal transmitted to the output circuit is a voltage. This is accomplished by using a non-inverting amplifier 304 in the signal path, as will be explained.

In signal processor 300, input voltage $V_{REF}$ is coupled to converter circuit 301 and level resistor circuit 315. Converter circuit 301 includes divider circuit 305 and voltage conversion circuit 306. The divider circuit 305 provides an output to conversion circuit 306, which provides an intermediate voltage is output signal to the non-inverting input (+) of op-amp 308. Divider circuit 305 can be used to adjust the magnitude of the input voltage to voltage conversion circuit 306. It is preferably implemented as a resistor divider to reduce the magnitude of the input voltage to voltage conversion circuit 306 by half. The resistor divider of divider circuit 305 can also be programmable to vary the ratio of the resistors and thus the magnitude of the input voltage signal to voltage conversion circuit 306. Alternatively, divider circuit 305 may be omitted resulting in a more limited programmability of level and output voltage range.

Conversion circuit 306 differs from current converter 12 in that it provides a voltage output instead of a current output as the intermediate signal which is generated based on the input control signal. In FIG. 6, the current $I_{DAC}$ is generated by circuit 201, and then flows through the feedback resistor circuit. In FIG. 8, on the other hand, the inverting input (−) of non-inverting amplifier 308 follows the non-inverting input (+), which, in turn, reflects the voltage at the output of the converter circuit 301. This voltage causes a current to flow in the parallel combination of level circuit 315 and gain circuit 310, which then flows through feedback circuit 320 to generate the output voltage. Gain circuit 310 is necessary to allow programmability of the output voltage range.

Level circuit 315 is composed of resistors 318, 319 and switches 316, 317 and has value $R_{POFS}$, Though the circuit in FIG. 8 shows two sets of resistors and switches in level resistor circuit 315, the number of switches and resistors may be varied to provide different characteristics for the circuit.

Level circuit 315 operates in the same manner and serves substantially the same function as the level resistor circuit 205 shown in FIG. 6. Thus, when the level value is configured to be smaller than the output voltage range, the signal processor 300 operates in bipolar mode. When the level is zero, the signal processor 300 operates in unipolar mode. When the level is greater than the output voltage range, the signal processor 300 operates in unipolar mode.

Gain circuit 310 includes resistors 313, 314 and switches 311, 312 to provide the resistor value $R_{PG}$. As above, the number of resistors and switches can be varied and need not be limited to two sets.

The feedback circuit 320 includes resistors 323, 324 and switches 321, 322 and operates in the same manner as feedback circuit 206 described above in FIG. 6. For example, one of switches 321 and 322 always must be turned ON for the circuit to operate. This can be accomplished by setting one switch to be closed or by using a switch-resistance compensation element. The blocks shown as level circuit 102 and feedback circuit 103 in FIG. 5 would be made up of level circuit 315, gain circuit 310, and feedback circuit 320.

The equation for the unipolar mode of circuit 300 in FIG. 8 is:

$$V_{OUT} = V_{REF} * K * \frac{\text{INPUT CODE}}{\text{MAX INPUT CODE}} \left(1 + \frac{R_{PFB}}{R_{PG}}\right) \quad (8)$$

where K is a divider ratio in the converter circuit 301. In unipolar mode, the gain of the output circuit in FIG. 8 is determined by the ratio of $R_{PFB}$ to $R_{PG}$, while the range of $V_{OUT}$ is determined by this gain and any magnitude modification provided in divider circuit 305.

In bipolar mode, or level-shifted unipolar mode, the output signal level is determined by the ratio of $R_{PFB}$ to $R_{POFS}$, while the output signal range is determined by the ratio of $R_{PFB}$ to the parallel combination of $R_{POFS}$ and $R_{PG}$. The output signal range is scaled by the divider ratio K. The equation for the bipolar mode and the level-shifted unipolar mode of circuit 300 is:

$$V_{OUT} = V_{REF} \left[ K * \frac{\text{INPUT CODE}}{\text{MAX INPUT CODE}} \left(1 + \frac{R_{PFB}}{\frac{R_{POFS} * R_{PG}}{R_{POFS} + R_{PG}}}\right) - \frac{R_{PFB}}{R_{POFS}} \right] \quad (9)$$

The same general conditions described in reference to the circuit and equations of FIG. 6 apply to the circuit described in reference to circuit 300 in FIG. 8. One difference between these circuits is that, in circuit 300, $V_{REF}$ is preferably divided down by voltage divider 305 as described above.

Figure 9:
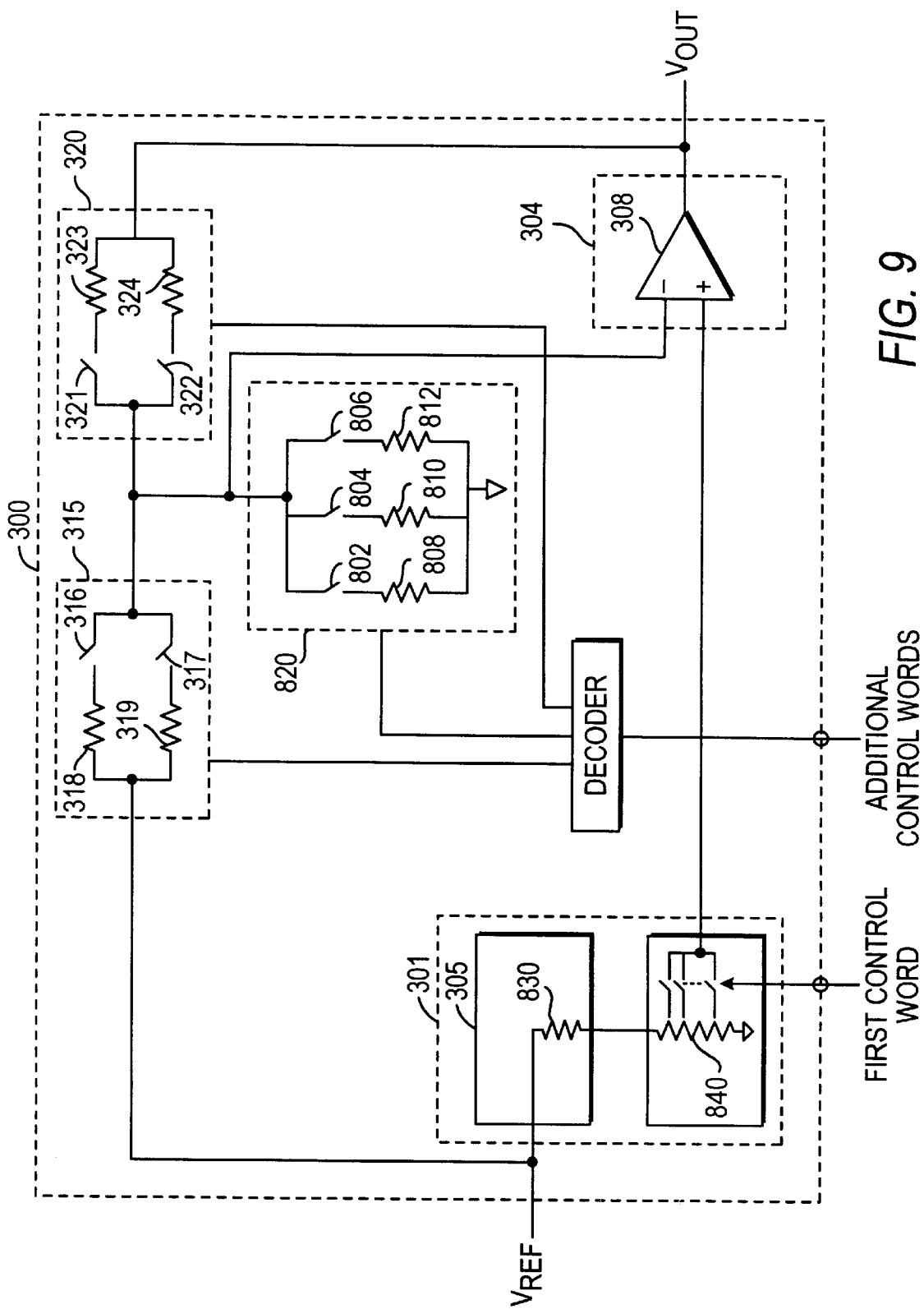
FIG. 9 is an alternative embodiment of the signal processor according to the present invention.

FIG. 9 shows a specific embodiment of a signal processor according to the principles shown in FIG. 8. In FIG. 9, circuits 305, 306 show one possible example of a configurable input impedance wherein divider circuit 305 is a single resistor and conversion circuit 306 implements a programmable resistor-string DAC. In one configuration, the impedance value of resistor 830 equals the impedance value of resistor 840. This results in K=0.5.

FIG. 9 also includes an additional resistor and switch in gain circuit 820. This shows the capability of these circuits to increase the number of resistors and switches to further govern the output voltage range and level.

FIG. 10 shows a table incorporating exemplary values and modes for settings of the circuit shown in FIG. 9.

Several preferred embodiments are described above. However, persons skilled in the art will appreciate that the present invention can be practiced in embodiments other than those illustrated above, including other known methods of modifying the level and output voltage range of $V_{OUT}$ in signal processing circuits. The present invention is only limited by the claims which follow.

What is claimed is:

1. A signal processor which receives an input signal, a first control word, a second control word, a third control word and provides an output signal, comprising:
   a converter circuit that receives the input signal and the first control word, and that provides a first intermediate signal, and that is programmable to modify the output signal of the signal processor;
   a level circuit, coupled to receive the input signal and the second control word, to provide a second intermediate signal, and that includes at least one switch which is set based on the second control word, to modify a level of the signal processor; and
   an output circuit that receives the third control word, the first intermediate signal and the second intermediate signal, and that provides the output signal, the output circuit being programmable to modify the level and an output signal range.

2. The signal processor according to claim 1, wherein the converter circuit includes an inverter circuit to change a polarity of the input signal.

3. The signal processor according to claim 1, wherein the converter circuit includes a programmable gain adjustment circuit to modify a magnitude of the input signal.

4. The signal processor according to claim 1, wherein the converter circuit includes a digital to analog converter circuit to modify a magnitude of the input signal, based on the first control word, to produce the first intermediate signal.

5. The signal processor according to claim 1, wherein the level circuit comprises a plurality of switches and impedances.

6. The signal processor according to claim 1, wherein the signal processor can operate in a mode selected from a group consisting of a) unipolar mode b) bipolar mode and c) level-shifted unipolar mode.

7. The signal processor according to claim 1, wherein the output circuit includes a feedback circuit coupled between an input and an output of the output circuit, and includes at least one switch, the at least one switch being set based on the third control word.

8. The signal processor according to claim 7, wherein the output signal range is symmetrical around a reference level.

9. The signal processor according to claim 7, wherein the output signal range is asymmetrical around a reference level.

10. The signal processor according to claim 7, wherein the feedback circuit comprises a plurality of switches and impedances.

11. The signal processor according to claim 1, wherein each of the first and second intermediate signals is a current signal.

12. The signal processor according to claim 1, wherein the first intermediate signal is a voltage signal.

13. The signal processor according to claim 12, wherein the second intermediate signal is a current signal.

14. The signal processor according to claim 1, wherein the second control word and the third control word are combined in a single control word.

15. A signal processor that receives an input signal, a first control word and a second control word, and provides an output signal, comprising:
   at least two control elements including;
      a first control element, that receives the first control word and the input signal, that is programmable based on the first control word, and that provides a first intermediate signal, and
      a second control element, that receives the output signal, that receives the second control word, and that provides a second intermediate signal; and
   a summing element that receives any combination of the first intermediate signal and the second intermediate signal, and provides the output signal, such that at least one characteristic of the output signal selected from a group consisting of a) a level b) a linearity c) an output signal range d) a combination thereof is programmable based on the first control word and the second control word.

16. The signal processor according to claim 15, the signal processor further comprising a third control element that receives the input signal, that is programmable based on a third control word, that provides a third intermediate signal to the summing element.

17. The signal processor according to claim 16, wherein at least one of a) the impedance value of the first control element b) the impedance value of the second control element c) the impedance value of the third control element and d) a combination thereof determines the mode in which the signal processor operates.

18. The signal processor according to claim 16, wherein the third control element comprises at least one programmable combination of an impedance and a switch, wherein said combination has an impedance value that is defined by controlling the switch.

19. The signal processor according to claim 15, wherein at least one of a) the first control element b) the second control element and c) both the first control element and second control element is a converter circuit including a digital-to-analog converter.

20. The signal processor according to claim 15, wherein the second control element is a programmable feedback circuit that provides a feedback path for the summing element.

21. The signal processor according to claim 15, wherein the summing element includes an amplifier.

22. The signal processor according to claim 15, wherein each of the first control element and second control element includes a plurality of switches and impedances.

23. The signal processor according to claim 15, wherein the signal processor can operate in a mode selected from a group consisting of a) unipolar mode b) bipolar mode and c) level-shifted unipolar mode.

24. The signal processor according to claim 15, wherein at least one of a) the first intermediate signal and b) the second intermediate signal is a current signal.

25. The signal processor according to claim 15, wherein at least one of a) the first intermediate signal and b) the second intermediate signal is a voltage signal.

26. The signal processor according to claim 15, wherein at least one of a) the first control element and b) the second control element comprises at least one programmable combination of an impedance and a switch, wherein said combination has an impedance value that is defined by controlling the switch.

27. A method of converting an input signal to an output signal in a signal processor circuit which includes a converter circuit, a level circuit and an output circuit, comprising:

providing an input signal to the converter circuit and the level circuit;

converting the input signal using the converter circuit to a first intermediate signal based on a first control word;

converting the input signal using the level circuit to a second intermediate signal based on a second control word;

providing the first and second intermediate signals and a third control word to the output circuit;

configuring the output circuit based on the third control word, wherein the second control word and the third control word each modify at least one characteristic of the output signal selected from a) an output signal range b) a linearity c) a level and d) a combination thereof.

28. The method according to claim 27, wherein configuring the output circuit comprises configuring a feedback path of the output circuit.

29. A signal processor circuit which includes a converter circuit, a level circuit and an output circuit, the signal processor for converting an input signal to an output signal, comprising:

a means for providing an input signal to the level circuit and the converter circuit;

a means for converting the input signal using a converter circuit to a first intermediate signal based on a first control word;

a means for converting the input signal using the level circuit to a second intermediate signal based on a second control word;

a means for providing the first and second intermediate signals and an third control word to the output circuit;

a means for configuring the output circuit based on the third control word, wherein the second control word and the third control word each modify at least one characteristic of the output signal selected from a) an output signal range b) a linearity c) a level and d) a combination thereof.

30. The signal processor of claim 29, wherein the means for configuring the output circuit comprises a means for configuring a feedback path of the output circuit.

* * * * *